US009490299B2

(12) United States Patent
Lee et al.

(10) Patent No.: US 9,490,299 B2
(45) Date of Patent: Nov. 8, 2016

(54) VARIABLE RESISTANCE MEMORY DEVICE

(71) Applicant: SK hynix Inc., Gyeonggi-do (KR)

(72) Inventors: Hyun Min Lee, Gyeonggi-do (KR); Han Woo Cho, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/872,893

(22) Filed: Oct. 1, 2015

(65) Prior Publication Data

US 2016/0020252 A1    Jan. 21, 2016

Related U.S. Application Data

(62) Division of application No. 14/024,140, filed on Sep. 11, 2013, now Pat. No. 9,184,386.

(30) Foreign Application Priority Data

May 30, 2013    (KR) ........................ 10-2013-0061503

(51) Int. Cl.
*H01L 27/24*    (2006.01)
*H01L 45/00*    (2006.01)
*H01L 27/22*    (2006.01)
*H01L 43/02*    (2006.01)

(52) U.S. Cl.
CPC ......... *H01L 27/2409* (2013.01); *H01L 27/224* (2013.01); *H01L 43/02* (2013.01); *H01L 45/06* (2013.01); *H01L 45/1233* (2013.01); *H01L 45/1246* (2013.01); *H01L 45/1253* (2013.01); *H01L 45/144* (2013.01); *H01L 45/1683* (2013.01)

(58) Field of Classification Search
CPC ............. H01L 27/2409; H01L 27/224; H01L 45/1253; H01L 45/1233
See application file for complete search history.

(56) References Cited

U.S. PATENT DOCUMENTS

| | | | |
|---|---|---|---|
| 2003/0116794 A1* | 6/2003 | Lowrey | H01L 45/06 257/296 |
| 2009/0298223 A1* | 12/2009 | Cheek | H01L 27/2436 438/102 |
| 2014/0319634 A1* | 10/2014 | Shukh | H01L 27/224 257/427 |

* cited by examiner

*Primary Examiner* — Matthew Reames
(74) *Attorney, Agent, or Firm* — IP & T Group LLP

(57) ABSTRACT

A variable resistance memory device and a method of manufacturing the same are provided. The variable resistance memory device includes a first insulating layer formed on a semiconductor substrate, the first insulating layer having a first hole formed therein. A switching device is formed in the first hole. A second insulating layer is formed over the first insulating layer and the second insulating layer includes a second hole. A lower electrode is formed along a surface of the second insulating layer that defines the second hole. A spacer is formed on the lower electrode and exposes a portion of the surface of the lower electrode. A variable resistance material layer is formed in the second hole, and an upper electrode is formed on the variable resistance material layer.

5 Claims, 4 Drawing Sheets

VARIABLE RESISTANCE MEMORY DEVICE

CROSS-REFERENCES TO RELATED APPLICATION

This application is a division of U.S. patent application Ser. No. 14/024,140 filed on Sep. 11, 2013, which claims priority under 35 U.S.C. 119(a) to Korean application number 10-2013-0061503, filed on May 30, 2013, in the Korean Patent Office. The disclosure of each of the foregoing applications is incorporated by reference in its entirety.

BACKGROUND OF THE INVENTION

1. Technical Field

Various implementations relate to a nonvolatile memory device, and more particularly, to a variable resistance memory device and a method of manufacturing the same.

2. Related Art

In recent years, with demands on semiconductor devices with high performance and low power, next generation semiconductor memory devices with non-volatility and no refresh have been researched. As one of the next-generation semiconductor memory devices, variable resistance memory devices have been suggested. Such and there are phase-change random access memory devices (PCRAMs), resistive RAMs (ReRAMs), magnetic RAMs (MRAMs), spin-transfer torque magnetoresistive RAMS (STTMRAMs), and polymer RAMs (PoRAMs) as the variable resistance memory devices.

The variable resistance memory devices perform a memory operation to have a set state or a reset state by controlling a phase-change material, which constitutes a data storage unit, to a crystalline state or an amorphous state.

Here, since more current is required in switching to the reset state of the variable resistance memory device than in switching to the set state, the current for switching to the reset state, that is, a reset current has to be lowered to obtain a high degree of integration.

In recent years, variable resistance memory devices having a confined structure are suggested to obtain a high degree of integration. There is a need for improving reliability of the variable resistance memory devices by improving stability of a process in a method of fabricating the variable resistance memory devices having the confined structure.

SUMMARY

Various implementations are provided to a variable resistance memory device capable of improving stability of a process, and a method of manufacturing the same.

An exemplary variable resistance memory device may include a first insulating layer formed on a semiconductor substrate, the first insulating layer having a first hole formed therein; a switching device formed in the first hole; a second insulating layer formed over the first insulating layer, the second insulating layer including a second hole; a lower electrode formed along a surface of the second insulating layer that defines the second hole; a spacer formed on the lower electrode, the spacer exposing a portion of the surface of the lower electrode; a variable resistance material layer formed in the second hole; and an upper electrode formed on the variable resistance material layer.

An exemplary method of manufacturing an exemplary variable resistance memory device may include: forming an insulating layer over a switching device on a semiconductor substrate; forming a hole the insulating layer; forming a lower electrode on sidewalls of the insulating layer that defines the hole, and on a bottom surface that defines the hole; forming in a step-wise manner, a spacer on the lower electrode, the spacer exposing a portion of the lower electrode; forming a variable resistance material layer in the hole; and forming an upper electrode on the variable resistance material layer.

These and other features, aspects, and implementations are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
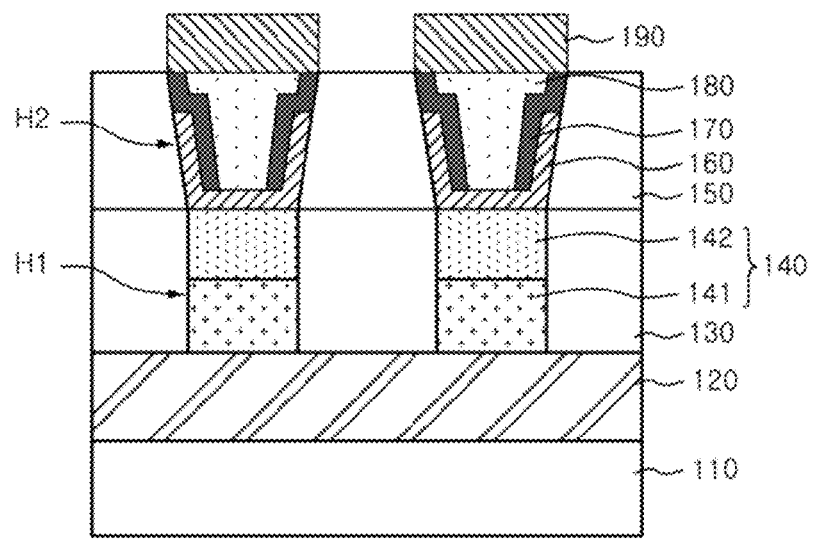
FIG. 1 is a view illustrating a structure of an exemplary variable resistance memory device.

Hereinafter, exemplary implementations will be described in greater detail with reference to the accompanying drawings.

Exemplary implementations are described herein with reference to cross-sectional illustrations that are schematic illustrations of exemplary implementations (and intermediate structures). As such, variations from the shapes of the illustrations as a result, for example, of manufacturing techniques and/or tolerances, are to be expected. Thus, exemplary implementations should not be construed as limited to the particular shapes of regions illustrated herein but may be to include deviations in shapes that result, for example, from manufacturing. In the drawings, lengths and sizes of layers and regions may be exaggerated for clarity. Throughout the disclosure, reference numerals correspond directly to the like numbered parts in the various figures and embodiments of the present invention.

FIG. 1 is a view illustrating a structure of a variable resistance memory device according to an exemplary implementation of the inventive concept.

Referring to FIG. 1, an exemplary variable resistance memory device according may include an N$^+$-type type base region 120 formed on a semiconductor substrate 110 and a first interlayer insulating layer 130 formed on the N$^+$-type base region 120. The first interlayer insulating layer 130 may include a plurality of holes H1. A switching device 140 may be formed in each of the plurality of holes in the first interlayer insulating layer 130, and may include an N-type region 141 and a P-type region 142. A second interlayer insulating layer 150 may be formed on the first interlayer insulating layer 130, including the switching device 140 and may include a plurality of holes H2. A lower electrode 160 may be formed along bottom walls and sidewalls defining a hole H2, of the plurality of holes H2, formed in the second interlayer insulating layer 150. A lower electrode 160 may be formed on portions of the sidewalls to a height that is lower, by a predetermined height, than a depth of the hole to prevent current flow generated between the lower electrode 160 and an upper electrode 190.

A spacer 170 may be formed on the lower electrode 160, along the sidewalls that define the hole H2, and on a surface of the lower electrode, so that a portion of the surface of the lower electrode is exposed. A variable resistance material layer 180 may be formed in the hole H2, of the plurality of holes H2, formed in the second interlayer insulating layer 150, to bury the lower electrode 160 and the spacer 170. An upper electrode may be formed on the variable resistance material layer 180. In an exemplary implementation, a PN diode, including the N-type region 141 and the P-type region 142, has been illustrated as the switching device 140 in FIG. 1, but the switching device 140 is not limited thereto. The switching device 140 may be a Schottky diode or a MOS transistor.

The variable resistance material layer 180 may include a phase-change material to store data, the phase-change material may include, for example, $Ge_2Sb_2Te_5$ GST).

Further, the spacer 170, which is formed between the second interlayer insulating layer 150 and the variable resistance material layer 180, and between the lower electrode 160 and variable resistance material layer 180, is formed in a stepwise shape to reduce a contact area between the lower electrode 160 and the variable resistance material layer 180 and thus to reduce a reset current.

An exemplary method of manufacturing the exemplary variable resistance memory device will be described in detail with reference to FIGS. 2A to 2F.

FIGS. 2A to 2F are views illustrating an exemplary method of manufacturing an exemplary variable resistance memory device.

Figure 2A:
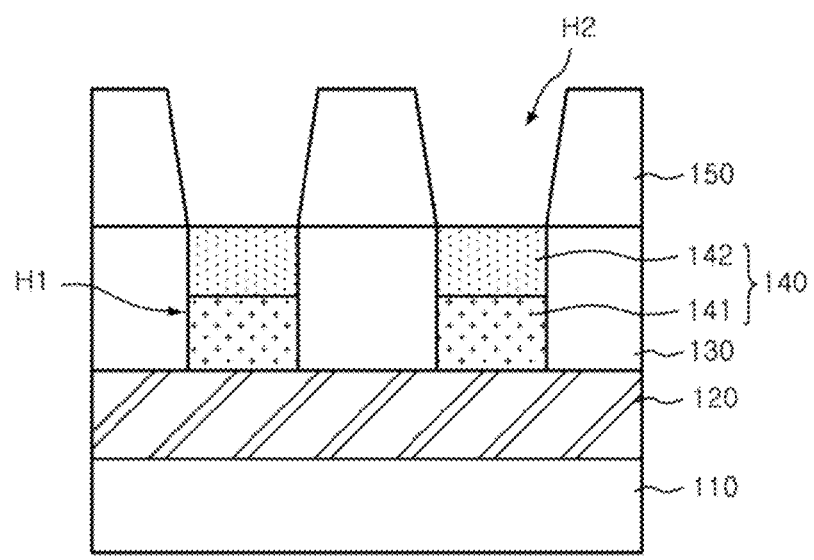
FIGS. 2A to 2F are views illustrating an exemplary method of manufacturing a variable resistance memory device.

As illustrated in FIG. 2A, an N+-type base region 120, which may serve as a word line, may be formed by implanting N-type impurities into an upper portion of a semiconductor substrate 110. A first interlayer insulating layer 130 may be formed on the N+-type base region 120. A hole H1 may be formed in the first interlayer insulating layer 130. A switching device 140, including an N-type region 141 and a P-type region 142, may be formed in the hole H1. Next, a second interlayer insulating layer 150 may be is deposited on the first interlayer insulating layer 130 and the switching device 140. A hole H2 may be formed in the second interlayer insulating layer 150, through a process such as photolithography, to expose an upper surface of the switching device 140. The hole H2 may be formed so that a sidewall and a bottom surface that define the hole H2 form an angle of about 80 degrees to about 90 degrees. The hole H2 may have a depth of about 1200 Å to about 1400 Å.

Figure 2B:
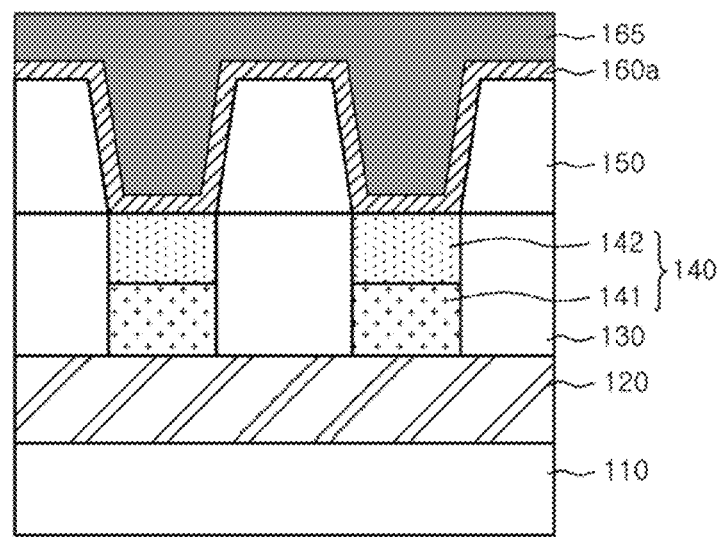

As illustrated in FIG. 2B, a lower electrode material 160a may be formed in the hole H2 over the second interlayer insulating layer 150. The lower electrode material 160a may have a thickness of about 130 Å to about 170 Å. In a preferred implementation, a portion of the lower electrode material 160a that is formed on sidewalls of the second interlayer insulating layer 150 that define the hole H2 may have a thickness that is about 85% to about 95% of a thickness of a portion of the lower electrode material 160a that is formed on a surface that defines a bottom of the hole H2. The lower electrode material 160a may include, for example, titanium nitride (TIN) containing no carbon. The lack of carbon in the lower electrode material 160a prevents a migration of carbon from the lower electrode material 160a to the variable resistance layer 180, when the variable resistance layer 180 is heated. This improves the reliability of the variable resistance memory device by preventing a change in composition of the variable resistance material.

A sacrificial layer 165 is formed on the lower electrode material 160a to fill the hole H2. The sacrificial layer 165 may protect the portion of the lower electrode material 160a that is formed on the surface of the second interlayer insulating layer 150 that defines the bottom of the hole H2, when a the portion of the lower electrode material 160a that is formed on the sidewalls of the second interlayer insulating layer 150 that define the hole H2 are removed in a subsequent process. The sacrificial layer 165 may be formed, for example, of a silicon nitride.

Figure 2C:
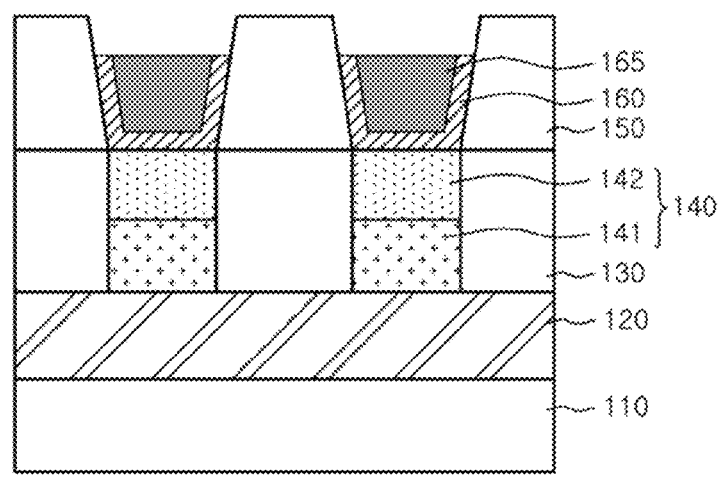

As illustrated in FIG. 2C, a lower electrode 160 may be formed by
a first etching the sacrificial layer 165 to a predetermined height from a top of the second interlayer insulating layer 150, and by a second etching the lower electrode material 160a to the predetermined height which the sacrificial layer is removed to expose the sidewalls of the second interlayer insulating layer 150 that define the hole H2. The first etching process using, for example, a fluorine-based (CFx) etching material may be used to selectively etch the lower electrode material 160a. The predetermined may be from about 500 Å to about 700 Å. A ratio of an etch selectivity of the sacrificial layer 165 to an etch selectivity the lower electrode material 160a may be about 1:5. The second etching using, for example, a wet etching method may be used to the lower electrode material 160a disposed on the sidewall of the upper portion of the hole H. At this time the wet etch process may be performed under the condition that a ratio of sulfuric acid having etch selectivity to the sacrificial layer 165 to hydrogen peroxide is 50:1.

Figure 2D:
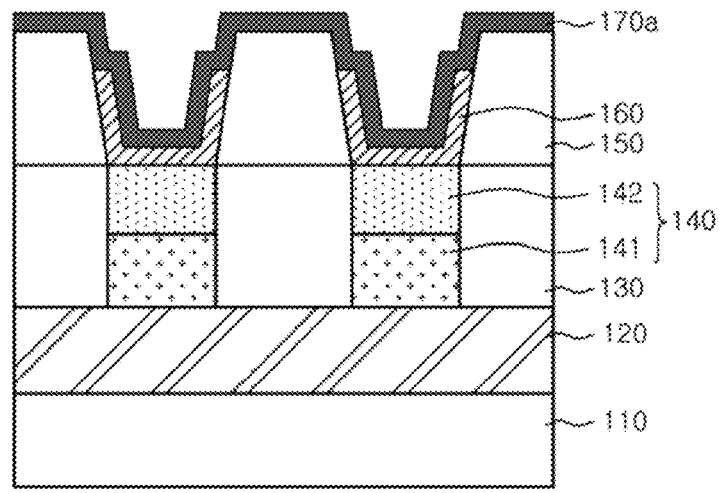

As illustrated in FIG. 2D, the remaining sacrificial layer 165 may be completely removed from the lower electrode 160, by, for example, selectively etching with phosphoric acid. A spacer material 170a may be formed in a step-wise manner on the surface of the second interlayer insulating layer 150 and on a surface of the lower electrode 160 that defines that hole H2. The spacer material 170a may include a nitride material.

Figure 2E:
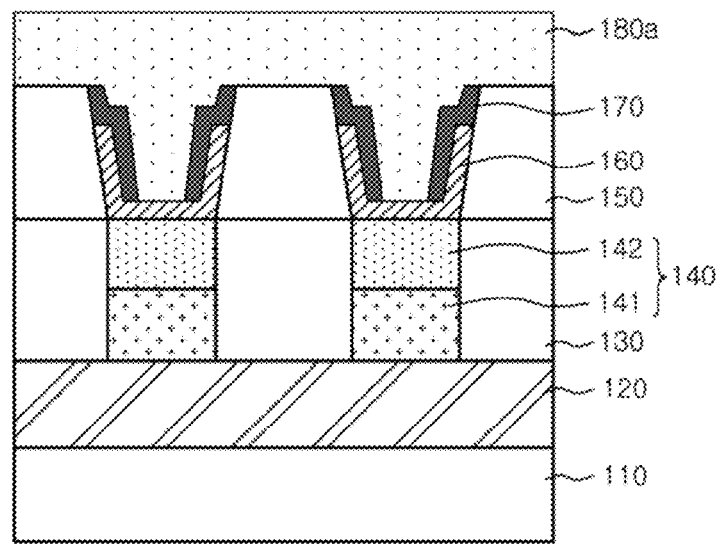

As illustrated in FIG. 2E, a spacer 170 may be formed in a stepwise manner by selectively etching the spacer material 170a to expose a portion of the surface of the lower electrode 160 and the surface of the second interlayer insulating layer 150. A variable resistance material 180a may be formed on the surface of the second interlayer insulating layer 150 to fill the hole H2. The variable resistance material layer 180 may include, for example, $Ge_2Sb_2Te_5$ (GST).

Figure 2F:
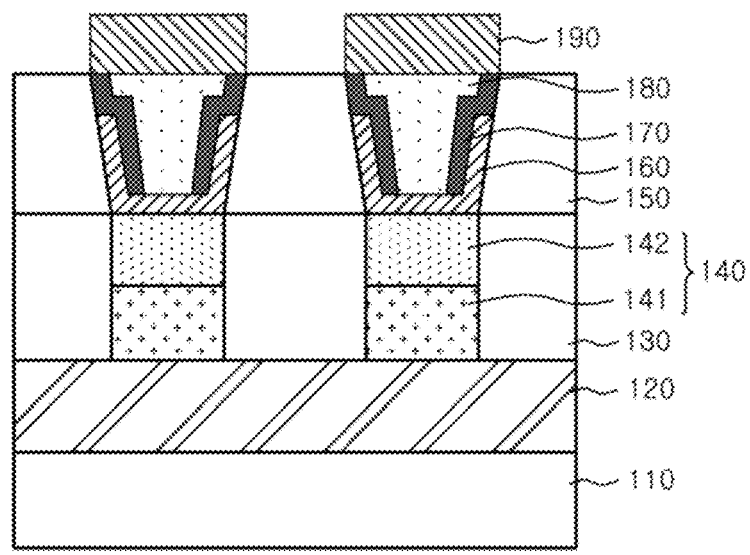

As illustrated in FIG. 2F, the variable resistance material layer 180 may be formed by planarizing the variable resistance material 180a. An upper electrode 190 may be formed on the variable resistance material layer 180.

The above exemplary implementation is illustrative and not limitative. Various alternatives and equivalents are possible. The invention is not limited by the implementation described herein, nor is the invention limited to any specific type of semiconductor device. Other additions, subtractions, or modifications are obvious in view of the present disclosure and are intended to fall within the scope of the appended claims.

What is claimed is:
1. A variable resistance memory device, comprising:
a first insulating layer formed on a semiconductor substrate, the first insulating layer having a first hole formed therein;
a switching device formed in the first hole;
a second insulating layer formed over the first insulating layer, the second insulating layer including a second hole configured to expose a surface of the switching device and sidewalls of the second insulating layer;

a lower electrode conformally formed on the surface of the switching device and the sidewalls of the second insulating layer exposed through the second hole;

a spacer conformally formed on a surface of the lower electrode and the sidewalls of the second insulating layer exposed through the second hole, the spacer having a shape of a staircase and exposing a portion of the surface of the lower electrode;

a variable resistance material layer formed on the spacer to fill the second hole; and an upper electrode formed on the variable resistance material layer, wherein a length of the lower electrode on the sidewalls of the second insulating layer is longer than a length of the spacer on the sidewalls of the second insulating layer.

2. The variable resistance memory device of claim 1, wherein a height a portion of the lower electrode that is formed on the sidewalls of the second insulating layer that define the second hole is less than a depth of the second hole by a predetermined height.

3. The variable resistance memory device of claim 2, wherein the lower electrode is formed of a material that does not contain carbon.

4. The variable resistance memory device of claim 1, wherein an intersection of the sidewalls of the second insulating layer that define the hole and the surface that defines the bottom of the hole forms an angle of about 80 degrees to about 90 degrees.

5. The variable resistance memory device of claim 1, wherein the upper electrode directly contacts an upper surface of the variable resistance material layer and an upper surface of the spacer.

* * * * *